US005710566A

United States Patent [19]

Grabow et al.

[11] Patent Number: 5,710,566

[45] Date of Patent: Jan. 20, 1998

[54] METHOD FOR IMPLEMENTING A WIRELESS DATA EXCHANGE BETWEEN A FIXED STATION AND MOVING OBJECTS PARTICULARLY VEHICLES

[75] Inventors: Wilhelm Grabow, Nordstemmen; Felix Dobias, Lange Trift, both of Germany

[73] Assignee: Robert Bosch GmbH, Germany

[21] Appl. No.: 734,420

[22] Filed: Oct. 16, 1996

Related U.S. Application Data

[63] Continuation of Ser. No. 252,309, Jun. 1, 1994, abandoned.

[30] Foreign Application Priority Data

Jun. 1, 1993 [DE] Germany .......................... 43 18 108.2

[51] Int. Cl.[6] .............................. G01S 5/04; H03M 1/60; G08G 1/00

[52] U.S. Cl. .......................... 342/457; 342/158; 342/422; 340/928; 340/825.54

[58] Field of Search .............................. 342/46, 50, 158, 342/422, 428, 429, 457, 463; 340/905, 928, 933, 825.54, 825.72; 235/384

[56] References Cited

U.S. PATENT DOCUMENTS

| | | | |
|---|---|---|---|
| 3,474,460 | 10/1969 | Huebscher . | |
| 4,107,675 | 8/1978 | Sellers et al. | 342/42 |
| 5,128,669 | 7/1992 | Dadds et al. | 340/901 |
| 5,192,954 | 3/1993 | Brockelsby et al. | 342/42 |
| 5,227,803 | 7/1993 | O'Connor et al. | 342/442 |
| 5,406,275 | 4/1995 | Hassett et al. | 340/933 |
| 5,448,248 | 9/1995 | Antilla | 342/400 |

FOREIGN PATENT DOCUMENTS

| | | |
|---|---|---|
| 0 401 192 | 12/1990 | European Pat. Off. . |
| 0 416 692 | 3/1991 | European Pat. Off. . |
| 0 585 718 | 3/1994 | European Pat. Off. . |
| 0 588 045 | 3/1994 | European Pat. Off. . |
| 41 07 803 | 9/1992 | Germany . |

*Primary Examiner*—Gregory C. Issing
*Attorney, Agent, or Firm*—Kenyon & Kenyon

[57] ABSTRACT

A method for implementing a wireless data exchange between a fixed station and sending/receiving devices on board objects moving relative to the fixed station, preferably in lanes, and particularly vehicles. Using an antenna arrangement of the fixed station, the sending and/or receiving profile of which can be electronically aligned with an object, allows reliable determination of location using the antenna arrangement, in that in a first phase, a search territory is swept and checked for response signals from objects by means of a varying alignment of the sending and/or receiving profile. The time of reception of a response signal is correlated with the instantaneous adjustment values of the sending and/or receiving profile to determine the location. In a second phase, the sending and/or receiving profile is fixed on a sending/receiving device of an object whose location has been determined, and it is tracked, if necessary, while the data exchange is conducted.

14 Claims, 2 Drawing Sheets

METHOD FOR IMPLEMENTING A WIRELESS DATA EXCHANGE BETWEEN A FIXED STATION AND MOVING OBJECTS PARTICULARLY VEHICLES

This is a continuation of application Ser. No. 08/252,309 filed on Jun. 1, 1994 now abandoned.

FIELD OF THE INVENTION

The present invention relates to a method for implementing a wireless data exchange between a fixed station and sending/receiving devices on board objects moving relative to the fixed station, preferably in lanes, particularly vehicles, using an antenna arrangement of the fixed station, the sending and/or receiving profile of which can be electronically aligned with an object.

BACKGROUND INFORMATION

German Patent Application No. DE 41 07 803 A1, in one possible application of its scanning arrangement, describes automatic payment of toll fees. Each vehicle that must pay a toll fee is equipped with an automatic debit device which has another sending/receiving device. The sending/receiving device is activated by another sending/receiving device installed in a fixed location at the toll booth. A dialog between the two devices is initiated.

The debit device first posts the toll fee, and then sends a receipt for it to the sending/receiving device of the toll booth. During this process, a sending and/or receiving profile is generated for each of the vehicles by an antenna arrangement consisting of several individual antenna elements. For this purpose, according to a first solution, antennas are provided, the sending and/or receiving profiles of which are fixed on predetermined inspection regions. In this case, an antenna has to be present for every lane or for every section of a lane in which a vehicle is driving. If the territory to be covered consists of many lanes, then a very complicated arrangement consisting of many antennas is necessary.

In a second solution, the antenna arrangement consists of several phase-controlled individual antennas, which are able to track the moving vehicles with the sending and/or receiving profiles. Of course, information about the location of the individual vehicles is required for this purpose. This location information is provided by induction loops recessed into the road. This makes it rather complicated to obtain the location information, and it is frequently not accurate enough, since the induction loops can only be used to estimate the location of the vehicle, and not the position of the sending/receiving device within the vehicle.

SUMMARY OF THE INVENTION

It is an object of the present invention to improve the determination of location information, such that the effort and expenditure for additionally required technical means is as low as possible.

To accomplish this task, in the method according to the present invention, in a first phase, a search territory is swept and checked for response signals from objects by means of a varying alignment of the sending and/or receiving profile, with the time of reception of a response signal being correlated with the instantaneous adjustment values of the sending and/or receiving profile to determine the location. In a second phase, the sending and/or receiving profile is fixed on a sending/receiving device of a vehicle whose location has been determined, while the data exchange is conducted.

The method according to the present invention is based on the fact that the location information is determined with the antenna arrangement of the fixed station, with a special search phase being provided for the determination of location within the method according to the present invention, while the actual data exchange takes place during the subsequent second phase. By separating the method according to the present invention into a search process to determine location and a subsequent data exchange process, it is possible to undertake the determination of location in a simple manner and very rapidly, without any noteworthy data exchange, and to then conduct the data exchange in a very targeted manner, in the second phase, in which the location of the sending/receiving device of the object is estimated with sufficient accuracy so that the sending and/or receiving profile of the antenna arrangement can be adjusted to this object for the purpose of the data exchange.

It will generally be advantageous to have the sending and/or receiving profile of the antenna arrangement track during the data exchange. This can be done using known techniques, for example by evaluating an amplitude change of the signal received by the fixed station during the data exchange.

In a preferred embodiment of the method according to the present invention, the velocity of the object is already estimated during the search process, and tracking in the second phase is carried out on the basis of the estimated velocity. The sending or receiving profiles adjusted during the search process can overlap, so that multiple response signals can occur. A good estimate of the location can be made by an evaluation of the signal amplitude received by the antenna arrangement in each instance.

The accuracy of the location determination in the search phase can be increased by having the search territory swept by the sending and/or receiving profile of the antenna arrangement several times. Repeat sweeping of the search territory can take place in a manner different from a prior sweep, for example, with a different alignment of the sending and/or receiving profile, at a different speed, or even by sweeping only part of the search territory. It is practical if the repeat sweep is controlled as a function of the response signals received during the prior sweep. Since the object continues to move during multiple search processes, the direction of movement can also be estimated from the response signals. This information can be advantageously used for the tracking process.

DETAILED DESCRIPTION

Figure 1:
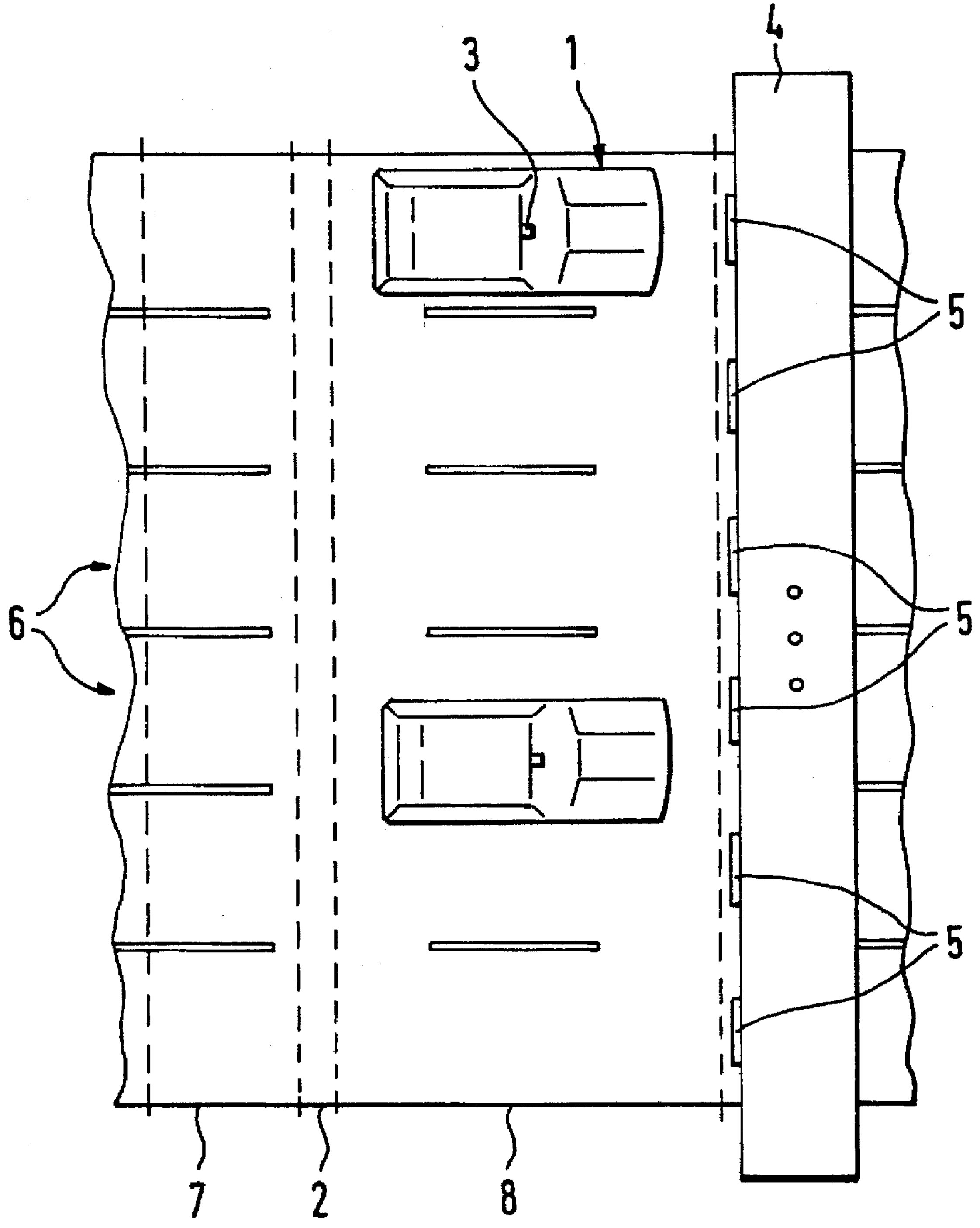
FIG. 1 is a schematic top view of vehicles with sending/receiving devices which are approaching a fixed station.

The arrangement shown in FIG. 1 serves to detect vehicles 1, which are moving within a predetermined segment 2 of a road and are equipped with a sending/receiving device (transceiver) 3, by means of a fixed station 4 which spans the road like a bridge, for example. The fixed station 4 is provided with several electronically controlled antennas 5, which can each be assigned to a lane 6, for example.

The sending/receiving devices 3 of the vehicles 1 are equipped with a processor which debits a required toll fee to a checking card which stores an amount of money in memory, for example. When entering the predetermined segment 2, each vehicle 1 must be subjected to an inspection to ensure that it has debited the required toll fee. For this purpose, the fixed station 4 sends a radio signal, for example a microwave signal, which activates the transmitters of the sending/receiving devices 3 of the vehicles 1, so that these send a receipt signal concerning the fact that the debit has taken place.

The fixed station 4 checks every single vehicle 1 entering the predetermined segment 2 (threshold area) to check whether or not it has sent a receipt signal. If this is not the case, the license number of the vehicle can be recorded, for example by photographing the vehicle, and thus the vehicle owner can be determined, so that the toll fee can be collected from him later.

The data transmission between the vehicles 1 and the fixed station 4 takes place in half-duplex mode, i.e., data from the fixed station 4 to the vehicles 1 (downlink) and in the reverse direction (uplink) are transmitted alternately. In the downlink, the antennas 5 of the fixed station 4 send data (for example concerning the amount to be paid) to the vehicle 1 during the data exchange, with the data being assigned to each vehicle by means of an identification signal.

FIG. 1 illustrates that the territory covered by the antennas 5 is divided into a search territory 7 and a data exchange territory 8. The antennas 5 sweep the part of the search territory 7 assigned to them (also possibly sweeping the overlapping areas in the lanes 6), and localize the sending/receiving devices 3 of vehicles 1 which are located in the search territory 7. After this determination of location, the data exchange takes place in the data exchange territory 8 (which also included the predetermined segment 2), with the antenna 5 in question remaining fixed on the related vehicle 1 (in particular, its sending/receiving device 3) and tracking the movement of the vehicle 1, if necessary.

Since only the existence of a response signal has to be checked by the fixed station 4 for the search in the search territory 7, the search process can be carried out extremely quickly. It is therefore also possible to repeat search processes, preferably using search strategies that have been modified as a function of the response signals received. On the basis of the location of a vehicle 1, using the localization of the corresponding sending/receiving device 3 that has been already determined, at least the starting position for the data exchange in the data exchange territory 8 can be indicated with sufficient certainty. In many cases, it will then be possible to complete the data exchange so quickly that, at the maximum possible velocity, the vehicle is located within the adjusted sending and/or receiving profile of the related antenna 5 for the entire duration of the data exchange, i.e. it remains more or less stationary. However, it is also possible and advantageous to increase reliability, to have the sending and/or receiving profile of the antenna 5 in question track the vehicle 1. This is preferably done using a velocity and, if applicable, direction of movement of the vehicle 1 which was/were estimated during the search process.

Figure 2:
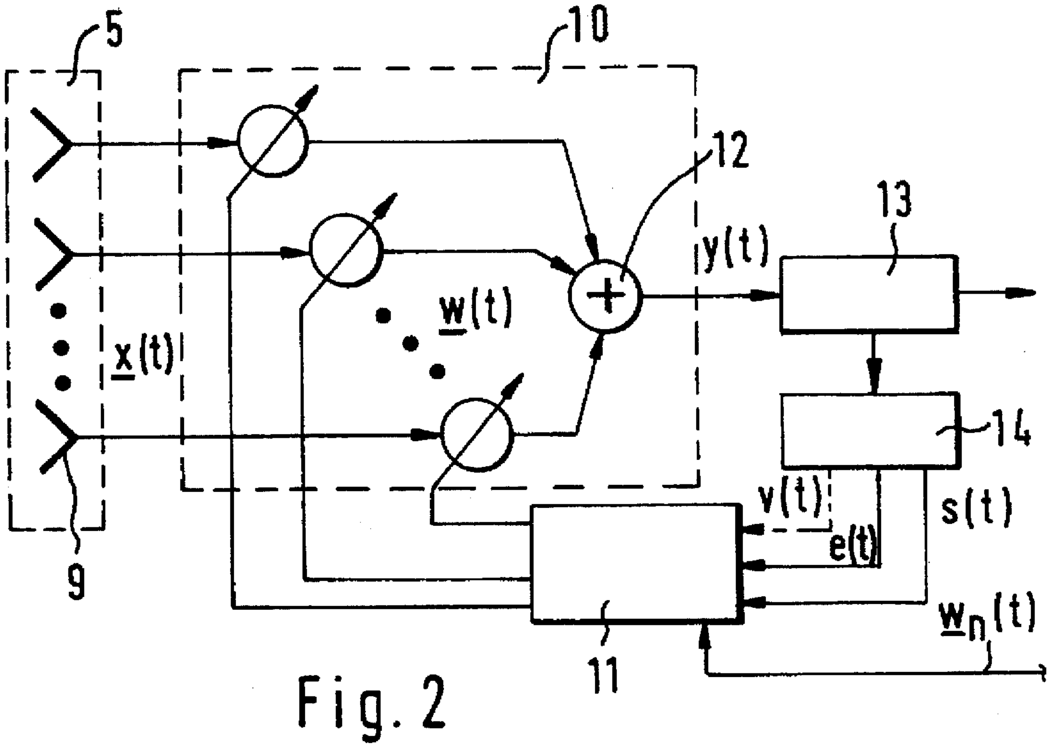
FIG. 2 is a block schematic for an electronically controlled antenna.

FIG. 2 shows an antenna 5 which includes several antenna elements 9. These are connected with a beam formation network 10, with which the sending and/or receiving profile of the antenna 5 can be adjusted.

For the case represented here, that of reception of the signal of a sending/receiving device 3 of a vehicle 1, the output signals of the antenna elements 9 are weighted in such a way that the antenna 5 directs a separate main reception beam at the vehicle 1 for the data transmission from the vehicle to the fixed station 4.

It is advantageous to use such antenna elements which receive circularly polarized signals, because these are less susceptible to interference with regard to single-reflected and even multiple-reflected signals (e.g. reflection on the road, on the vehicle itself, or on adjacent vehicles). A directing effect of the individual receiving profiles assigned to the vehicles 1, which also results in less susceptibility to interference, is achieved in that each receiving profile is generated by several antenna elements 9 switched together to form an emitter group. Each emitter group then delivers a reception signal.

For determining the location of individual vehicles 1 in the search territory 7, the antenna 5 receives signals from vehicles 1 that are located in the search territory 7 for this antenna 5. A processor 11 derives data about the current location of the individual vehicles 1 from the receptions signals X(t) of the individual antenna elements 9.

During the data exchange phase, using this location information, the signals of the individual antenna elements 9 are weighted in the beam formation network 10 which belongs to each antenna 5 (i.e., the signal phase and/or amplitude of each antenna element 9 is adjusted) in such a way that the antenna 5 generates a direction diagram for each vehicle, so that a main reception beam is directed at the vehicle 1 in question, and that the reception profile has the greatest possible reception attenuation in the direction of the other vehicles 1, which can potentially cause interference, relative to the main reception beam.

The phase and amplitude of each reception profile to be adjusted for each antenna element 9 are referred to in summarized manner as a complex weight vector w(t) in the following. The weighting can be applied either to continuous analog or time-discrete digital antenna reception signals x(t). The switching means for the weighting which are available in each reception signal value must be implemented accordingly. The weighting of individual antenna reception signals x(t) can be changed continuously, or only at discrete points in time. The number of antennas 5 with beam formation networks 10 that are connected is equal to the maximum number of vehicles 1 that the predetermined segment 2 covered by the fixed station 4 can hold, so that a separate reception profile can be assigned to each vehicle 1.

The reception signals received by each vehicle 1 and correspondingly weighted in the related beam formation network 10 are superimposed in an adder 12, and the sum signal y(t) formed is passed to a receiver 13.

If it is necessary to adapt the reception profile to the position of the vehicle, the adaptation can be repeated by determining the location during the data exchange (between two uplink transmissions).

Another adaptation method to improve the accuracy of location determination includes deriving control signals for the complex weight vectors w(t) from the output signal of the receiver 13 according to a quality criterion. An evaluation circuit, in combination with the processor 11, determines the ratio of a wanted signal to an interference signal output. The wanted signal is the signal received from the vehicle in question, at which the main reception beam should be directed. Interference signals are the signals received from other vehicles, to which regions attenuated as strongly as possible, in the ideal case zero positions, of the reception profile should be directed.

From the quality signal e(t) which comes about in this way, the processor 11 determines such complex weight factors w(t) for the beam formation network that an alignment of the main reception beam and the strongly attenuated regions of the reception profile comes about, which allows the quality signal e(t) to reach a maximum. For this purpose, the processor can also obtain information about the complex weight vectors $w_n(t)$ of adjacent beam formation networks.

It is advantageous, for the initial setting of the weight vectors w(t), that the evaluation circuit 14 can transmit an amplitude s(t) of the response signal or amplitudes s(t) determined during the search process, as well as information about a velocity v(t) of the vehicle 1 that has been determined, to the processor 11.

Figure 3:
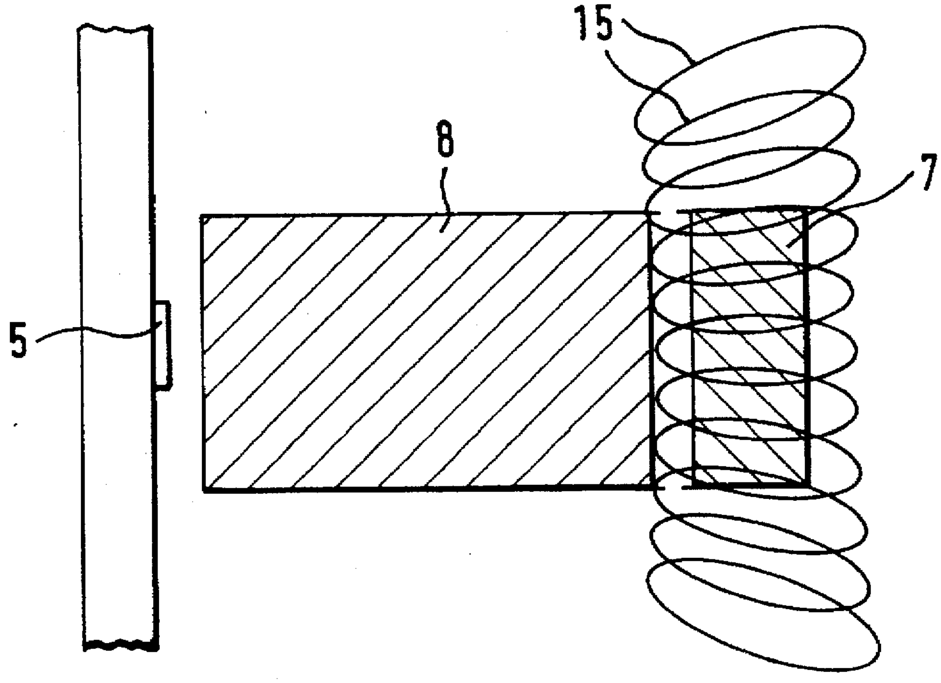
FIG. 3 is a schematic representation of the search process using an antenna pursuant to FIG. 2.

FIG. 3 illustrates the search process in the search territory 7 which belongs to an antenna 5. The circles 15 which are drawn in characterize −3 dB contours of the communication zone formed when sweeping the search territory 7 to determine location. In this connection, it is evident that both the search territory 7 and the data exchange territory 8 are not strictly separated from the corresponding territory of an adjacent antenna 5, which makes it evident that it is practical to also take information from the adjacent antennas 5 (and the weight vectors $w_n(t)$ of the adjacent beam formation networks 10) into consideration.

On the basis of the description of this embodiment, it has become clear that both the search and the tracking take place, in that the sending and/or receiving profile is formed in a beam shape exclusively with regard to reception, so that no direction selection is necessary with regard to the sending signals of the fixed station 4. Of course it is also possible to receive unselectively, and to use a defined sending profile for the search process and the data exchange process. Furthermore, a locally defined sending profile and a reception profile can be used in combination.

What is claimed is:

1. A method of performing a wireless data exchange between a fixed station and an object moving relative to the fixed station, the object moving on a road having a first lane, comprising the steps of:

in a first phase, sweeping a search territory in the first lane using a single antenna of the fixed station, the single antenna generating an output beam having a profile, checking for a response signal from a transceiver disposed on the object using the single antenna, and determining a location of the object with the single antenna based upon a correlation between a time of reception of the response signal and an instantaneous adjustment value of the profile of the single antenna, the instantaneous adjustment value indicating an instantaneous amplitude of the response signal; and in a second phase, fixing the profile of the single antenna on the transceiver of the object using the determined location of the object in the first lane in order to perform the data exchange between the single antenna and the transceiver of the object.

2. The method according to claim 1, wherein the object is a vehicle.

3. The method according to claim 1, further comprising the step of tracking the object in the second phase.

4. The method according to claim 3, further comprising the step of estimating a velocity of the object in the first phase.

5. The method according to claim 4, wherein the object is tracked using the estimated velocity of the object.

6. The method according to claim 1, wherein the search territory is swept a plurality of times in order to determine at least one of the location and a direction of movement of the object.

7. The method according to claim 6, wherein during the plurality of sweeps, different alignments of the antenna arrangement profile are used.

8. The method according to claim 6, wherein only a portion of the search territory is swept.

9. The method according to claim 6, wherein the plurality of sweeps are performed at different speeds.

10. The method according to claim 6, wherein a second sweep is performed as a function of the response signal checked during a first sweep.

11. The method according to claim 1, further comprising the step of determining an amplitude of the response signal in the first phase.

12. A method of performing a wireless data exchange between a fixed station and a plurality of objects moving relative to the fixed station on a road, a first object of the plurality of objects moving on the road in a first lane of a plurality of lanes of the road, comprising the steps of:

in a first phase, sweeping a search territory in each lane of the plurality of lanes using a corresponding one of a plurality of antennas of the fixed station, the plurality of antennas corresponding to the plurality of lanes, a first antenna of the plurality of antennas corresponding to the first lane, the first antenna generating an output beam having a profile, checking for a response signal from a transceiver disposed on the first object using the first antenna, and determining a location of the first object using only the first antenna based upon a correlation between a time of reception of the response signal and an instantaneous adjustment value of the profile of the first antenna, the instantaneous adjustment value indicating an instantaneous amplitude of the response signal; and in a second phase, fixing the profile of the first antenna on the transceiver of the first object in the first lane using the determined location of the first object in order to perform the data exchange between the transceiver of the first object and the first antenna.

13. The method according to claim 12, wherein the plurality of objects include a plurality of vehicles moving in the plurality of lanes of the road.

14. A method of performing a wireless data exchange between a fixed station and an object moving relative to the fixed station, the object moving on a road having a first lane, comprising the steps of:

in a first phase, scanning, with a first antenna which generates an output beam having a corresponding profile, a corresponding communication zone in the first lane, checking for a response signal from a transceiver disposed on the object appearing in the corresponding communication zone using the first antenna, and estimating a location of the object in the corresponding communication zone of the first lane with the first antenna based upon a correlation between a time of reception of the response signal and an instantaneous adjustment value of the profile of the first antenna, the instantaneous adjustment value indicating an instantaneous amplitude of the response signal; and in a second phase, tracking the profile of the first antenna on the transceiver to follow the motion of the object using the estimated location of the object in the first lane in order to perform the data exchange between the first antenna and the transceiver of the object.

* * * * *